(12) United States Patent
Ishiguro et al.

(10) Patent No.: US 10,930,807 B2
(45) Date of Patent: Feb. 23, 2021

(54) SOLAR CELL MODULE

(71) Applicant: PANASONIC INTELLECTUAL PROPERTY MANAGEMENT CO., LTD., Osaka (JP)

(72) Inventors: Tasuku Ishiguro, Osaka (JP); Yukihiro Yoshimine, Osaka (JP); Junpei Irikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/239,327

(22) Filed: Aug. 17, 2016

(65) Prior Publication Data

US 2016/0359064 A1    Dec. 8, 2016

Related U.S. Application Data

(63) Continuation of application No. PCT/JP2015/000632, filed on Feb. 12, 2015.

(30) Foreign Application Priority Data

Feb. 26, 2014   (JP) ................................ 2014-035110

(51) Int. Cl.
*H01L 31/048*   (2014.01)
*H01L 31/055*   (2014.01)
(Continued)

(52) U.S. Cl.
CPC .......... *H01L 31/048* (2013.01); *H01L 31/055* (2013.01); *H01L 31/0547* (2014.12); *H02S 30/10* (2014.12); *Y02E 10/52* (2013.01)

(58) Field of Classification Search
CPC ............. H01L 31/042; H01L 31/02322; H01L 31/0481; H01L 31/048; H01L 31/0547; H01L 31/055; H02S 30/10
See application file for complete search history.

(56) References Cited

U.S. PATENT DOCUMENTS

2004/0131792 A1* 7/2004 Bhattacharya .......... C23C 18/54
                                                              427/437
2009/0095341 A1   4/2009 Pfenninger et al.
(Continued)

FOREIGN PATENT DOCUMENTS

JP   2011-238639 A   11/2011
JP   2012-216620 A   11/2012
(Continued)

OTHER PUBLICATIONS

International Search Report dated Mar. 10, 2015, issued in counterpart application No. PCT/JP2015/000632 (2 pages).
(Continued)

*Primary Examiner* — Devina Pillay
(74) *Attorney, Agent, or Firm* — Westerman, Hattori, Daniels & Adrian, LLP

(57) ABSTRACT

A solar cell module having: a plurality of solar cells; a first protective member provided on the light-receiving surface side of the solar cells; a second protective member provided on the reverse surface side of the solar cells; a sealing layer for sealing the solar cells, the sealing layer being provided between the protective members; and a wavelength conversion substance for absorbing light of a specific wavelength and converting the light into light of a longer wavelength. The wavelength conversion substance is contained in at least a gap region, corresponding to the gap between the solar cells, of a reverse-surface-side region located on the side of the sealing layer nearer to the second protective member than the solar cells. The concentration of the wavelength conversion substance is higher in the gap region than in the region sandwiched by the reverse surface of the solar cells and the second protective member.

9 Claims, 5 Drawing Sheets

(51) Int. Cl.
*H02S 30/10* (2014.01)
*H01L 31/054* (2014.01)

(56) References Cited

U.S. PATENT DOCUMENTS

| | | | |
|---|---|---|---|
| 2010/0186801 A1 | 7/2010 | Boehm et al. | |
| 2010/0326522 A1* | 12/2010 | Okaniwa | H01L 31/02168 136/259 |
| 2012/0222723 A1 | 9/2012 | Mayer et al. | |
| 2012/0247536 A1 | 10/2012 | Kawai et al. | |
| 2012/0266942 A1 | 10/2012 | Komatsu et al. | |
| 2013/0125985 A1* | 5/2013 | Sawaki | H01L 31/0481 136/259 |
| 2013/0139868 A1* | 6/2013 | Zhang | C09K 11/06 136/247 |
| 2014/0007940 A1* | 1/2014 | Wu | B32B 17/10669 136/257 |
| 2015/0034147 A1* | 2/2015 | Le Perchec | H01L 31/055 136/251 |

FOREIGN PATENT DOCUMENTS

| | | |
|---|---|---|
| JP | 2012-230968 A | 11/2012 |
| JP | 2013-065595 A | 4/2013 |
| JP | 2013-120926 A | 6/2013 |
| JP | 2013-128153 A | 6/2013 |
| JP | 2013-168672 A | 8/2013 |
| JP | 2013-254854 A | 12/2013 |
| WO | 2011/148951 A1 | 12/2011 |
| WO | 2013/135980 A1 | 9/2013 |
| WO | WO 20130135980 A1 * 9/2013 ....... H01L 31/02322 |
| WO | 2014/160707 A1 | 10/2014 |

OTHER PUBLICATIONS

Extended (supplementary) European Search Report dated Feb. 8, 2017, issued in counterpart European Application No. 15754831.4. (9 pages).

Office Action dated May 28, 2020, issued in counterpart EP Application No. 15 754 831.4 (7 pages).

Trupke, T. et al., "Improving solar cell efficiencies by down-conversion of high-energy photons", Journal of Applied Physics, Aug. 1, 2002, vol. 92, No. 3, p. 1668-1674; Cited in EP Office Action dated May 28, 2020.

* cited by examiner

SOLAR CELL MODULE

CROSS-REFERENCE TO RELATED APPLICATION

The present application is a continuation under 35 U.S.C. § 120 of PCT/JP2015/000632, filed Feb. 12, 2015, which is incorporated herein by reference and which claimed priority to Japanese Patent Application No. 2014-035110 filed Feb. 26, 2014. The present application likewise claims priority under 35 U.S.C. § 119 to Japanese Patent Application No. 2014-035110 filed Feb. 26, 2014, the entire content of which is also incorporated herein by reference.

TECHNICAL FIELD

The present disclosure relates to a solar cell module.

BACKGROUND ART

There has been known a solar cell module that includes a wavelength conversion material which absorbs light of a specific wavelength and converts the light into light of a longer wavelength. By use of such a solar cell module, it is possible to convert, of incident light, light in a wavelength region contributing less to power generation into light in a wavelength region contributing largely to power generation. For example, Patent Literature 1 has disclosed a solar cell module that includes a first encapsulant layer not containing a wavelength conversion material and a second encapsulant layer containing a wavelength conversion material between a protective glass and a solar cell.

CITATION LIST

Patent Literature

PATENT LITERATURE 1: WO2011/148951

SUMMARY OF INVENTION

Technical Problem

Meanwhile, the solar cell module has been required to refine usage efficiency of the incident light to improve incident photon-to-current conversion efficiency. In addition, the solar cell module has been desired to not only be high in the incident photon-to-current conversion efficiency but also look good and be excellent in design.

Solution to Problem

A solar cell module according to the present disclosure includes a plurality of solar cells, a first protective member provided on a light-receiving surface side of the solar cells, a second protective member provided on a rear-surface side of the solar cells, a encapsulant layer provided between the respective protective members and sealing the solar cells, and a wavelength conversion material absorbing light of a specific wavelength and converting the light into light of a longer wavelength, in which the Wavelength conversion material is contained in at least a gap region which is in a rear-surface side area in the encapsulant layer located closer to a side of the second protective material than the solar cell and corresponds to a gap between the solar cells, and a concentration of the wavelength conversion material is higher in the gap region than in a region sandwiched by the rear surface of the solar cell and the second protective member.

Advantageous Effects of Invention

According to the solar cell module of the present disclosure, usage efficiency of the incident light can be refined to improve incident photon-to-current conversion efficiency. In addition, the solar cell module according to the present disclosure looks good and is excellent in design, for example.

DESCRIPTION OF EMBODIMENTS

Hereinafter, a description is given in detail of an example of embodiments with reference to the drawings.

The drawings referred to in the embodiments are schematically expressed, and a size ratio or the like of a component drawn in the figure may be different from an actual object in some cases. The concrete size ratio or the like should be determined in consideration of the following explanation.

In the description, a "light receiving surface" of a solar cell module and solar cell refers to a surface on which a light is mainly incident (more than 50% up to 100% of the light is incident on the light receiving surface) and a "rear surface" refers to a surface on a side opposite to the light receiving surface. Further, a description "provide a first member on a second member" or the like is not necessarily intended for only a case where the first and second members directly connect with each other, unless otherwise stated. In other words, the description includes a case where another member exists between the first and second members.

First Embodiment

Figure 1:
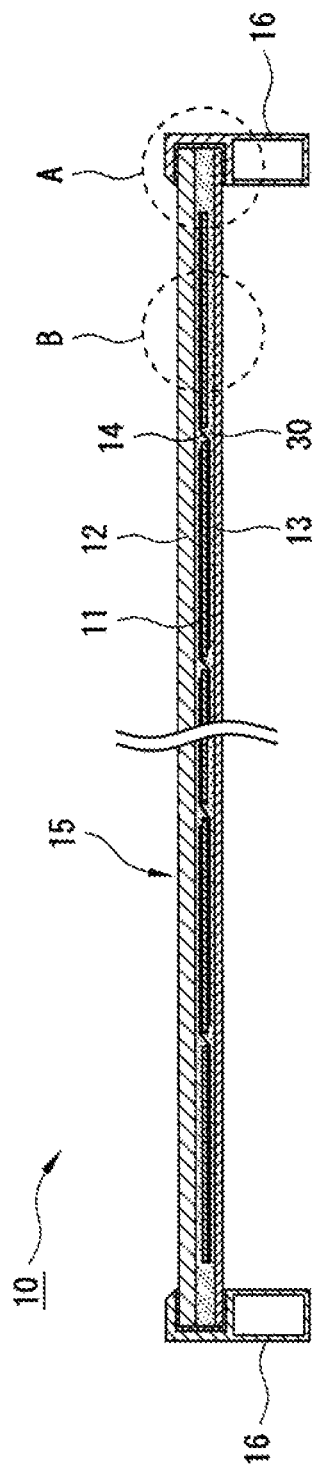
FIG. 1 is a sectional view of a solar cell module as a first embodiment.
Figure 2:
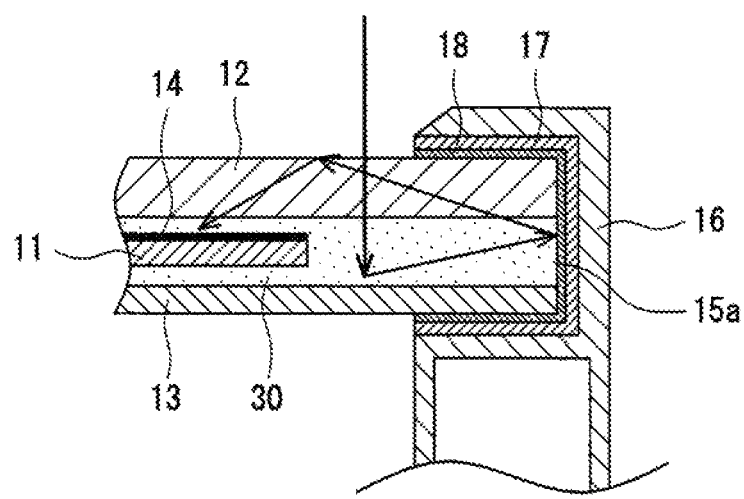
FIG. 2 is an enlarged view of A portion in FIG. 1.
Figure 3:
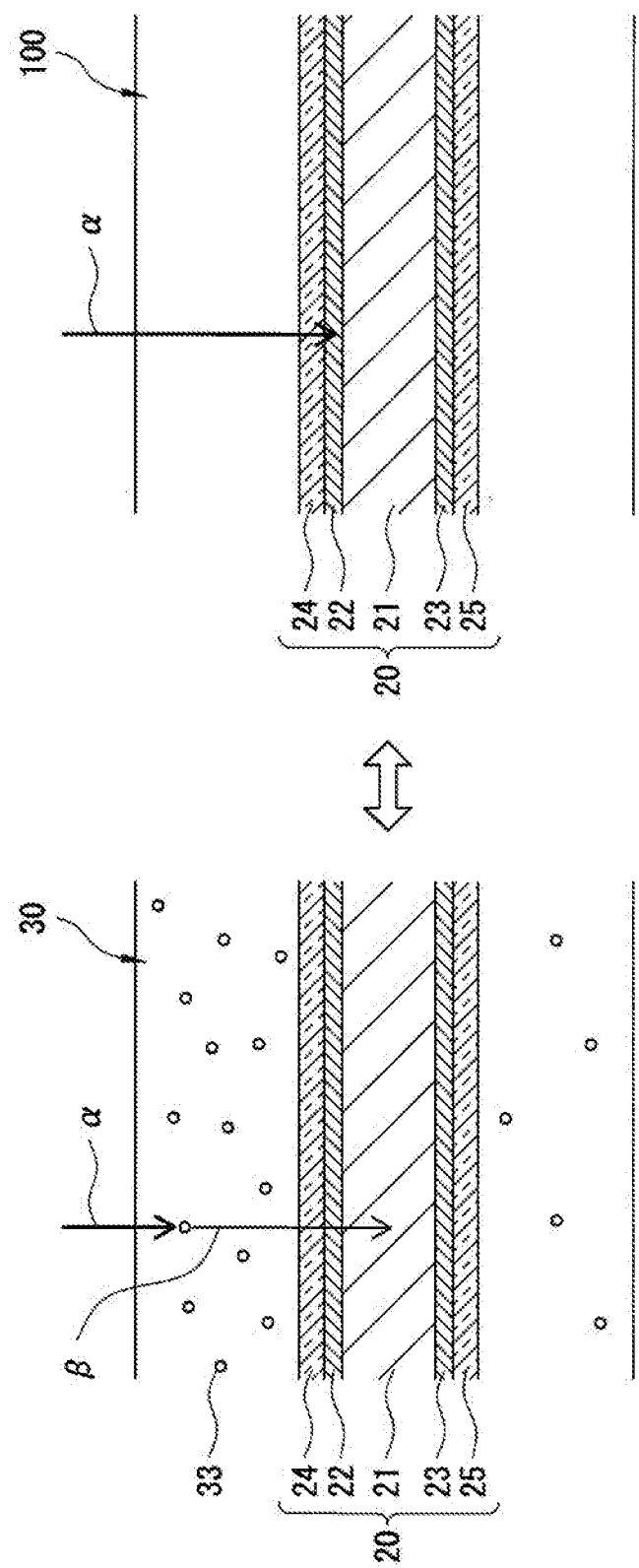
FIG. 3 is an enlarged view of B portion in FIG. 1.
Figure 4:
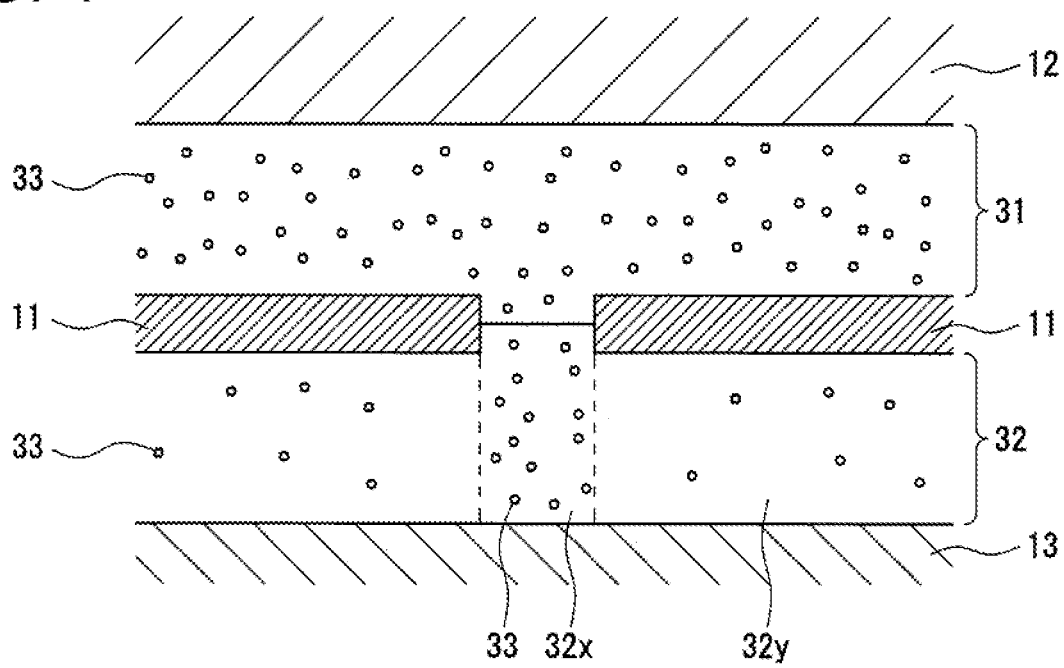
FIG. 4 is a sectional view of an encapsulant layer as the first embodiment.
Figure 5:
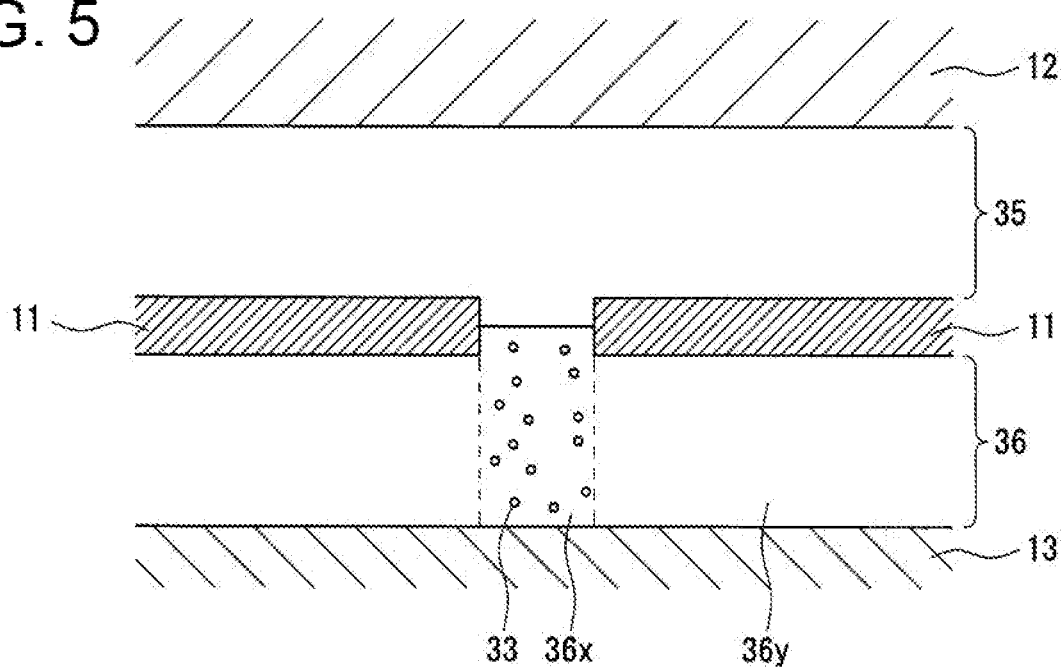
FIG. 5 is a diagram showing a modification example of the first embodiment.

Hereinafter, a description is given in detail of a solar cell module 10 as a first embodiment with reference to FIG. 1 to FIG. 5. FIG. 1 is a sectional view of the solar cell module 10 and FIG. 2 is an enlarged view of A portion in FIG. 1. FIG. 3 is an enlarged view of B portion in FIG. 1 and a structure of related art thereof is shown on the right side by way of comparison. In FIG. 3, each protective member, a conducting wire 14, and an electrode of a solar cell 11 are omitted. FIG. 4 is a sectional view of an encapsulant layer 30. The conducting wire 14 is also omitted in FIG. 4. In FIG. 3 and FIG. 4, a wavelength conversion material 33 is denoted by "O" for the purpose of illustration. FIG. 5 is a diagram showing a modification example of the embodiment.

As shown in FIG. 1, the solar cell module 10 includes a plurality of solar cells 11, a first protective member 12 provided on a light-receiving-surface side of the solar cells 11, and a second protective member 13 provided on a rear-surface side of the solar cells 11. The solar cells 11 are sandwiched between the first protective member 12 and the second protective member 13 and are sealed by the encapsulant layer 30 provided between the respective protective members. As is described later in detail, at least a gap region 32x of a rear-surface side area 32 in the encapsulant layer 30, the gap region 32x corresponding to a gap between the solar cells 11, contains the wavelength conversion material 33 which absorbs the light of a specific wavelength and converts the light into a light of a longer wavelength. In other words, the wavelength conversion material 33 may be contained in only the gap region 32x, or may be contained in substantially the entire area of the rear-surface side area 32. In the latter case, a concentration of the wavelength conversion material 33 is set to be higher in the gap region 32x than in a region (hidden region 32y) sandwiched between the rear surface of the solar cell 11 and the second protective member 13. In the former case, since the concentration of the wavelength conversion material 33 in the hidden region 32y is 0%, the concentration of the wavelength conversion material 33 is obviously higher in the gap region 32x than in the hidden region 32y. The encapsulant layer 30 is also referred to as a filler layer (filler).

In the embodiment, the plurality of solar cells 11 are arranged substantially on the same plane. The solar cells 11 that are adjacent, to each other are connected in series through the conducting wire 14, which forms a string of the solar cells 11. The conducting wire 14 is bent in a thickness direction of the module between the adjacent solar cells 11, and attached to each of the light receiving surface of one solar cell 11 and the rear surface of the other solar cell 11 by use of an adhesive or the like. A part of the conducting wire 14 is extended from an end of the string and connected with a wiring material for output (not shown). The wiring material is drawn out from, for example, a rear side of the second protective member 13 to be drawn into a terminal box (not shown).

The solar cell 11, the first protective member 12, the second protective member 13, and the encapsulant layer 30 constitute a solar cell panel 15. The solar cell panel 15 is a plate-like body having the string of the solar cells 11 sandwiched between the respective protective members as described above, and has a substantially rectangular shape in a plane view (in a case viewed from a direction vertical to the light receiving surface), for example. The second protective member 13 may be bent around to, for example, a lateral face 15a of the solar cell panel 15 to cover the lateral face 15a. The lateral face 15a is a face along a thickness direction of the solar cell panel 15.

Examples of the first protective member 12 may include a member having translucency such as a glass substrate, a resin substrate, or a resin film, for example. Of these, the glass substrate is used from the viewpoint of fire resistance, durability or the like. A thickness of the glass substrate is not specifically limited, but may be about 2 mm to 6 mm.

Examples of the second protective member 13 may include a transparent member the same as for the first protective member 12 and may include a non-transparent member. The embodiment uses the resin film as the second protective member 13. The resin film is not specifically limited, but may be a polyethylene terephthalate (PET) film. From the viewpoint of lowering moisture permeability or the like, the resin film may have formed therein an inorganic compound layer of silica and the like, or a metal layer of aluminium and the like in a case where it is not assumed that the light is incident on the rear-surface side. A thickness of the resin film is not specifically limited, but may be 100 μm to 300 μm.

The solar cell module 10 may include a frame 16 attached to an end edge of the solar cell panel 15. The frame 16 protects the end edge of the solar cell panel 15 and is used when the solar cell module 10 is installed on a roof or the like. The frame 16 is made of a metal such as stainless-steel, aluminium or the like, for example, and has a main body of a hollow construction and a concave portion in which the end edge of the solar cell panel 15 is fitted. An adhesive 17 of a silicone resin-based adhesive or the like, for example, is filled in a gap between the concave portion of the frame 16 and the solar cell panel 15.

As shown in FIG. 2, the solar cell module 10 may include a reflector 18 which is provided to cover the lateral face 15a of the solar cell panel 15. The reflector 18 reflects the light wavelength-converted by the wavelength conversion material 33 and confines the light to go out from the end edge of the solar cell panel 15 to the panel, functioning to increase the light incident on the solar cell 11. In general, the reflector 18 reflects also light other than the wavelength-converted light. Since the wavelength conversion material 33 having absorbed the light of a specific wavelength isotropically emits the light, installation of the reflector 18 is particularly effective in the solar cell module 10 provided with the wavelength conversion material 33.

The reflector 18 may cover substantially the entire lateral face 15a and covers a light receiving surface of the first protective member 12 and a rear surface of the second protective member 13 which are located at the end edge of the solar cell panel 15. However, the reflector 18 is limited to be provided at a portion on each protective member covered by the frame 16. The reflector 18 which is, for example, a resin sheet containing a white pigment or the like is attached to the end edge of the solar cell panel 15. Alternatively, a coating film may be formed on the end edge of the solar cell panel 15 or the concave portion of the frame 16 by use of a white paint and the coating film used as the reflector 18. Moreover, the adhesive 17 to which the white pigment or the like is added may be made to function as the reflector 18.

As shown in FIG. 3, the solar cell 11 includes a photoelectric conversion part 20 which receives sunlight to generate carriers. The photoelectric conversion part 20 has, as electrodes for collecting the generated carriers, a light-receiving-surface electrode formed on the light receiving surface of the photoelectric conversion part 20 and a rear-surface electrode formed on the rear surface (neither not shown). Each electrode is electrically connected with the conducting wire 14. However, a structure of the solar cell 11 is not limited thereto, and may have a structure in which the electrode is formed only on the rear surface of the photoelectric conversion part 20, for example. Note that the rear-surface electrode is formed to have an area larger than the light-receiving-surface electrode, and a surface having a larger electrode area (or a surface having the electrode formed thereon) may be said to be the "rear surface" of the solar cell 11.

The photoelectric conversion part 20 has, for example, a semiconductor substrate 21, amorphous semiconductor layers 22 and 23 formed on the substrate, and transparent conductive layers 24 and 25 formed on the amorphous semiconductor layers. Examples of the semiconductor constituting the semiconductor substrate 21 include crystalline silicon (c-Si), gallium arsenide (GaAs), indium phosphide (InP) and the like. Examples of the amorphous semiconductor constituting the amorphous semiconductor layers 22 and 23 include i-type amorphous silicon, n-type amorphous silicon, p-type amorphous silicon and the like. The transparent conductive layers 24 and 25 include, a transparent conductive oxide in which metal oxide such as indium oxide ($In_2O_3$), sine oxide (ZnO) is doped with tin (Sn), antimony (Sb) or the like, for example.

In the embodiment, an n-type single-crystal silicon substrate is applied to the semiconductor substrate 21. The photoelectric conversion part 20 has a structure in which an i-type amorphous silicon layer, a p-type amorphous silicon layer, and the transparent conductive layer 24 are formed in this order on a light receiving surface of the n-type single-crystal silicon substrate, and an i-type amorphous silicon layer, an n-type amorphous silicon layer, and the transparent conductive layer 25 are formed in this order on a rear surface of the substrate. Alternatively, the p-type amorphous silicon layer may be formed on the rear-surface side of the n-type single-crystal silicon substrate and the n-type amorphous silicon layer may be formed on the light-receiving-surface side of the substrate, respectively. In other words, the photoelectric conversion part 20 has a junction (heterojunction) between the semiconductors in which optical gaps are different from each other. The amorphous silicon layer forming the heterojunction (thickness: several nm to several tens of nm) generally absorbs the light having a wavelength of 600 nm or less.

As described later in detail, the wavelength conversion material 33 contained in the encapsulant layer 30 absorbs and wavelength-converts the light of a wavelength having an energy equal to or more than a bandgap of the amorphous semiconductor layers 22 and 23, which are each a heterojunction layer.

Hereinafter, a description is further given of the structure of the encapsulant layer 30 with reference to FIG. 3 and FIG. 4.

The encapsulant layer 30 which is provided between each protective member and the solar cell 11 functions to prevent moisture or the like from contacting the solar cell 11. The encapsulant layer 30 contains the wavelength conversion material 33 in at least the gap region 32x of the rear-surface side area 32. As shown in FIG. 3 and FIG. 4, in the embodiment, the wavelength conversion material 33 is also contained in the light-receiving-surface side area 31 and the hidden region 32y of the rear-surface side area 32. Moreover, the wavelength conversion material 33 may be contained in the end edge of the solar cell panel 15, that is, is between the lateral face 15a of the solar cell panel 15 and the solar cell 11 positioned at an end of the string.

Here, the light-receiving-surface side area 31 is an area in the encapsulant layer 30 located closer to the first protective member 12 side than the solar cell 11. The rear-surface side area 32 is an area in the encapsulant layer 30 located closer to the second protective member 13 side than the solar cell 11. The gap region 32x is an area corresponding to a gap between the solar cells 11 in the rear-surface side area 32. The hidden region 32y is an area sandwiched between the rear surface of the solar cell 11 and the second protective member 13 in the rear-surface side area 32. A description is given later of concentration distributions of the wavelength conversion material 33 in the respective areas of the encapsulant layer 30, particularly, the rear-surface side area 32.

The encapsulant layer 30 is formed in a laminating process described later using a resin sheet constituting the light-receiving-surface side area 31 (hereinafter, referred to as "resin sheet 31") and a resin sheet constituting the rear-surface side area 32 (hereinafter, referred to as "resin sheet 32"), for example. In FIG. 4, a boundary between the light-receiving-surface side area 31 and the rear-surface side area 32 is clearly defined, but the boundary may not be confirmed in some cases, depending on a kind of the resin and conditions of the laminating process.

The resin constituting the encapsulant layer 30 may be one having excellent adhesion to each protective member and the solar cell 11, and unlikely to be permeable to moisture. Specifically, examples of the resins include an olefin-based resin obtained by polymerizing at least one kind selected from α olefin having the carbon number of 2 to 20 (e.g., polyethylene, polypropylene, a random or block copolymer of ethylene and other α olefin, etc.), an ester-based resin (e.g., polycondensate of polyol and polycarboxylic acid or acid anhydride/lower alkyl ester, etc.), a urethane-based resin (e.g., polyaddition compound of polyisocyanate and active hydrogen group-containing compound (diol, polyol, dicarboxylic acid, polycarboxylic acid, polyamine, polythiol, etc.) or the like), an epoxy-based resin (e.g., ring-opening polymer of polyepoxide, polyaddition compound of polyepoxide and the active hydrogen group-containing compound, etc.), and a copolymer of α olefin and carboxylic acid vinyl, acrylic acid ester, or other vinyl monomer.

Preferable are the olefin-based resin (in particular, polymer including ethylene), and the copolymer of α olefin and carboxylic acid vinyl. Ethylene vinyl acetate copolymer (EVA) may be as the copolymer of α olefin and carboxylic acid vinyl.

The thickness of the encapsulant layer 30 is not specifically limited, but the thicknesses of the light-receiving-surface side area 31 and the rear-surface side area 32 are each about 100 to 600 μm, for example. A high crosslink density resin is generally used for the light-receiving-surface side area 31 and a low crosslink density resin or non-crosslinked resin is generally used for the rear-surface side area 32, depending on the structure or intended purpose (usage environment) of the solar cell module 10.

A refractive index of the encapsulant layer 30 may be set to be higher than a refractive index of an outermost layer of the first protective member 12 at the area containing the wavelength conversion material 33. In other words, in a case where the first protective member 12 is the glass substrate, the refractive index of the encapsulant layer 30 may be set to be higher than the refractive index of a glass surface. The refractive index of the encapsulant layer 30 can be adjusted by, for example, adequately changing a composition of resin components. Since the wavelength conversion material 33 having absorbed the light of a specific wavelength isotropically emits the light, there exists light passing through the glass to go out from the panel, but a totally reflected component at the glass surface is increased by the adjustment of the refractive index, preventing the relevant light from going out.

The wavelength conversion material 33, which is a material absorbing light of a specific wavelength and converting the wavelength as described above, converts light in a wavelength region contributing less to power generation into light in a wavelength region contributing largely to power generation. The wavelength conversion material 33 absorbs ultraviolet rays that are light of a shorter wavelength than 380 nm, for example, to convert into light of a longer wavelength (e.g., 400 to 800 nm). In this case, the wavelength conversion material 33 also contributes to deterioration suppression of the constituent material due to the ultraviolet rays.

The wavelength conversion material 33 is one that absorbs the ultraviolet rays to emit visible light, for example, but may be a material that absorbs visible light or infrared light. In general, the wavelength conversion material 33 converts the shorter wavelength into the longer wavelength, but may be a material performing a so-called upconversion emission in which the longer wavelength is converted into the shorter wavelength. A converted wavelength depends on a kind of the solar cell 11.

In a case where the solar cell 11 has the heterojunction layer, the wavelength conversion material 33 absorbs and wavelength-converts the light of a wavelength having an energy equal to or more than a bandgap of the heterojunction layer, as described above. In other words, the wavelength conversion material 33 converts the light of the wavelength absorbed into the heterojunction layer. In the embodiment, the wavelength conversion material 33 is used which can absorb light α of a wavelength λα absorbed by the amorphous semiconductor layers 22 and 23 which are each the heterojunction layer to convert into light β of a wavelength λβ not absorbed by the semiconductor layers (see FIG. 3). λα is equal to or less than 600 nm, for example. On the other hand, in a case of using an encapsulant layer 100 in which the wavelength conversion material 33 like this does not exist, a part of the light α is absorbed by the amorphous semiconductor layers 22 and 23.

Concrete examples of the wavelength conversion material 33 include semiconductor nanoparticles (quantum dot), luminescent metal complexes, organic fluorescent dyes and the like. Examples of the semiconductor nanoparticle include nanoparticles of zinc oxide (ZnO), cadmium selenide (CdSe), cadmium telluride (CdTe), gallium nitride (GaN), yttrium oxide ($Y_2O_3$), indium phosphide (InP) and the like. Examples of the luminescent metal complex include an Ir complex such as $[Ir(bqn)_3]$ $(PF_6)_3$, $[Ir(dpbpy)_3]$ $(PF_6)_3$ or the like, a Ru complex such as $[Ru(bqn)_3]$ $(PF_6)_3$, $[Ru(bpy)_3]$ $(ClO_4)_2$ or the like, an Eu complex such as $[Eu(FOD)_3]$ phen, $[Eu(TFA)_3]$ phen or the like, and a Tb complex such as $[Tb(FOD)_3]$phen, $[Tb(HFA)_3]$ phen or the like. Examples of the organic fluorescent dye include a rhodamine-based dye, a coumarin-based dye, a fluorescein-based dye, a perylene-based dye and the like.

Hereinafter, a description is given of concentration distributions of the wavelength conversion material 33 in the respective areas of the encapsulant layer 30. The embodiment is based on the assumption that one kind of wavelength conversion material 33 is used. In the following description, a concentration of the wavelength conversion material 33 is designated as "$\rho_{33}$".

The gap region 32x and the hidden region 32y are different from each other with respect to $\rho_{33}$ in the rear-surface side area 32 (see FIG. 4). This allows the usage efficiency of the wavelength conversion material 33 to be improved, for example. In the case where the wavelength conversion material 33 is contained in substantially the entire area of the rear-surface side area 32, ρ33 is set to be higher in the gap region 32x than in the hidden region 32y. In other words, a concentration gradient of the wavelength conversion material 33 exists in the rear-surface side area 32 and the wavelength conversion material 33 is biasedly held in the gap region 32x, for example. Additionally, $\rho_{33}$ in the end edge of the solar cell panel 15 may be, for example, substantially the same as $\rho_{33}$ in the gap region 32x.

The reason why $\rho_{33}$ in the gap region 32x>$\rho_{33}$ in the hidden region 32y should hold is due to a difference in an amount of incident light in the gap region 32x and in the hidden region 32y. In other words, the hidden region 32y is a region hidden by the solar cell 11 when seen from the light-receiving-surface side as well as a region with a lower amount of incident light. On the other hand, the gap region 32x is a region with a larger amount of incident light because the solar cell 11 does not exist on the light-receiving-surface side. Therefore, the wavelength conversion material 33 being biasedly held in the gap region 32x is important in efficiently using the wavelength conversion material 33, which is expensive. This allows the wavelength conversion efficiency to be enhanced while suppressing a usage amount of the wavelength conversion material 33.

Moreover, also from the viewpoint of design improvement of the solar cell module 10, the wavelength conversion material 33 may be biasedly held in the gap region 32x. In other words, since a contrast of hue is large between a region where the solar cell 11 exists and a region positioned at a gap between the solar cells 11, the contrast is reduced by biasedly holding the wavelength conversion material 33 in the gap region 32x. In this case, the wavelength conversion material 33 may be used which is capable of conversion into a light of a wavelength close to reflected light from the solar cell 11. For example, in a case where the solar cell 11 involves a blue color (reflected light is blue), a wavelength conversion material 33 is used which absorbs the ultraviolet rays having a wavelength of 380 nm or less to convert into light having a wavelength close to the blue color (e.g., 450 to 490 nm).

In the rear-surface side area 32, the closer to the gap region 32x, the more may be increased gradually or in a stepwise fashion. Additionally, the concentration gradient of the wavelength conversion material 33 may exist in a thickness direction of the rear-surface side area 32. The wavelength conversion material 33 may be contained in, for example, an area adjacent to the solar cell 11 (light-receiving-surface side area 31) in larger amounts than in an area adjacent to the second protective member 13, and the closer to the second protective member 13, the more $\rho_{33}$ may be decreased gradually or in a stepwise fashion.

Concretely, $\rho_{33}$ in the gap region 32x is may be 0.1 to 15 wt % with respect to a total weight of the gap region 32x or 1.5 to 10 wt %, in a case where the wavelength conversion material 33 is an inorganic system compound such as a semiconductor nanoparticle, a luminescent metal complex and the like. $\rho_{33}$ may be 0.02 to 2.0 wt % with respect to the total weight of the gap region 32x or 0.05 to 0.8 wt %, in a case where the wavelength conversion material 33 is an organic system compound such as an organic fluorescent dye and the like. $\rho_{33}$ in the hidden region 32y may be 0 to 5 wt % with respect to a total weight of the hidden region 32y or 0 to 2 wt %, in a case where the wavelength conversion material 33 is an inorganic system compound. $\rho_{33}$ may be 0 to 0.5 wt % with respect to the total weight of the hidden region 32y or 0 to 0.1 wt %, in a case where the wavelength conversion material 33 is an organic system compound.

$\rho_{33}$ in the light-receiving-surface side area 31 is substantially uniform, for example. Alternatively, the wavelength conversion material 33 may be contained in an area adjacent to the first protective member 12 in larger amounts than in an area adjacent to solar cell 11, and the closer to the second protective member 13, the more $\rho_{33}$ may be decreased gradually or in a stepwise fashion.

$\rho_{33}$ in the light-receiving-surface side area 31 and $\rho_{33}$ in the gap region 32x may be substantially the same as or different from each other. From the viewpoint of incident photon-to-current conversion efficiency improvement, $\rho_{33}$ in the light-receiving-surface side area $31 \geq \rho_{33}$ in the gap region $32x$ holds, for example. In order to reduce the above contrast to make the look refined, $\rho_{33}$ in the light-receiving-surface side area $31 \leq \rho_{33}$ gap region $32x$ may hold. In either case, both $\rho_{33}$ in the light-receiving-surface side area 31 and $\rho_{33}$ in the gap region $32x > \rho_{33}$ in the hidden region $32y$ holds, for example.

Note that an ultraviolet-ray absorption material, an anti-oxidizing agent, a flame retardant or the like, besides the wavelength conversion material 33, may be added to the encapsulant layer 30. A pigment of titanium oxide or the like may be added to the rear-surface side area 32 in a case where it is not assumed that the light is incident on the rear-surface side. The ultraviolet-ray absorption material, which is a material selectively absorbing ultraviolet rays that are light of a shorter wavelength than 380 nm, does not have a wavelength-conversion function like the wavelength conversion material 33. Concrete examples of the ultraviolet-ray absorption material include a benzotriazole-based compound, a benzophenone-based compound, a salicylate-based compound, a cyanoacrylate-based compound, a nickel-based compound, a triazine-based compound, and the like.

The solar cell module 10 including the above structure can be manufactured by laminating the string of the solar cells 11 connected by the conducting wire 14, by use of the resin sheet constituting the first protective member 12, the second protective member 13, and the encapsulant layer 30. In a laminate device, the first protective member 12, the resin sheet 31, the string of the solar cells 11, the resin sheet 32, and the second protective member 13 are laminated in this order on a heater, for example. This laminated body is heated to about 150° C. in a vacuum state. After that, heating is continued under an atmospheric pressure with each constituent member being pressed to the heater side to crosslink resin components in the resin sheet, obtaining the solar cell panel 15. Finally, the reflector 18, the terminal box, the frame 16 and the like are attached to the solar cell panel 15 to obtain the solar cell module 10.

The concentration gradient of the wavelength conversion material 33 in the rear-surface side area 32 can be formed by using a plurality of resin sheets as the resin sheet 32 in which contents of the wavelength conversion material 33 are different from each other, for example. As a concrete example, a resin sheet (referred to as resin sheet X) containing the wavelength conversion material 33 in large amounts, and a resin sheet (referred to as resin sheet Y) having a lower content of the wavelength conversion material 33 than the resin sheet X or not containing the wavelength conversion material 33 are used. Then, in the laminating process, the resin sheet X is arranged in a portion corresponding to the gap region $32x$ and the resin sheet Y is arranged in a portion corresponding to the hidden region $32y$.

Alternatively, a method may be used in which diffusion of the wavelength conversion material 33 from the light-receiving-surface side area 31 is used. For example, the resin sheet 31 containing the wavelength conversion material 33, and the resin sheet 32 having lower content of the wavelength conversion material 33 than the resin sheet 31 or not containing the wavelength conversion material 33 are used. By laminating these, the wavelength conversion material 33 is diffused from the resin sheet 31 to a portion which is to be the gap region $32x$ in the resin sheet 32, obtaining the above concentration gradient of the wavelength conversion material 33 in the rear-surface side area 32.

As described above, according to the solar cell module 10 having the above structure, the usage efficiency of the incident light can be refined to improve the incident photon-to-current conversion efficiency. In other words, in the solar cell module 10, efficient use of the wavelength conversion material 33 is allowed by devising the concentration distributions of the wavelength conversion material 33 particularly in the rear-surface side area 32 of the encapsulant layer 30. The incident light can be used more efficiently by biasedly holding the wavelength conversion material 33 in the gap region $32k$ of the rear-surface side area 32, compared with the case where the wavelength conversion material 33 is not contained in the rear-surface side area 32 and the case where the wavelength conversion material 33 is uniformly contained in the rear-surface side area 32.

Further, adding to the gap region $32x$ the wavelength conversion material 33 which emits light of a wavelength, close to a reflected light from the solar cell 11 can reduce the coloristic contrast between the region where the solar cell 11 exists and the region positioned at a gap between the solar cells. This allows a product that looks good and has excellent design to be obtained.

Note that, as shown in FIG. 5, the structure may be used in which the wavelength conversion material 33 is contained in only the gap region $36x$. In the example shown in FIG. 5, the wavelength conversion material 33 is substantially not contained in the light-receiving-surface side area 35 nor the hidden region $36y$ of the rear-surface side area 36. In other words, the concentration of the wavelength conversion, material 33 is substantially 0% in the hidden region $36y$. In this case, the wavelength conversion material 33 is contained between the solar cell 11 positioned at the end of the string and the lateral face $15a$ of the solar cell panel 15 at the concentration substantially the same as the gap region $36x$, for example. The structure is particularly directed to the purpose of improving the design by reducing the contrast.

Second Embodiment

Figure 6:
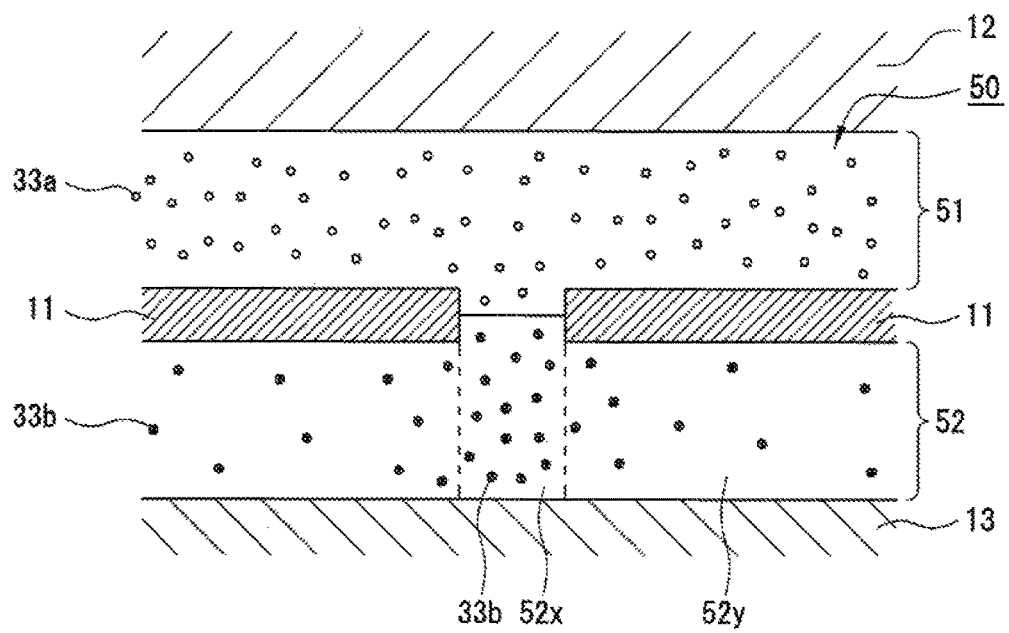
FIG. 6 is a sectional view of an encapsulant layer as a second embodiment.
Figure 7:
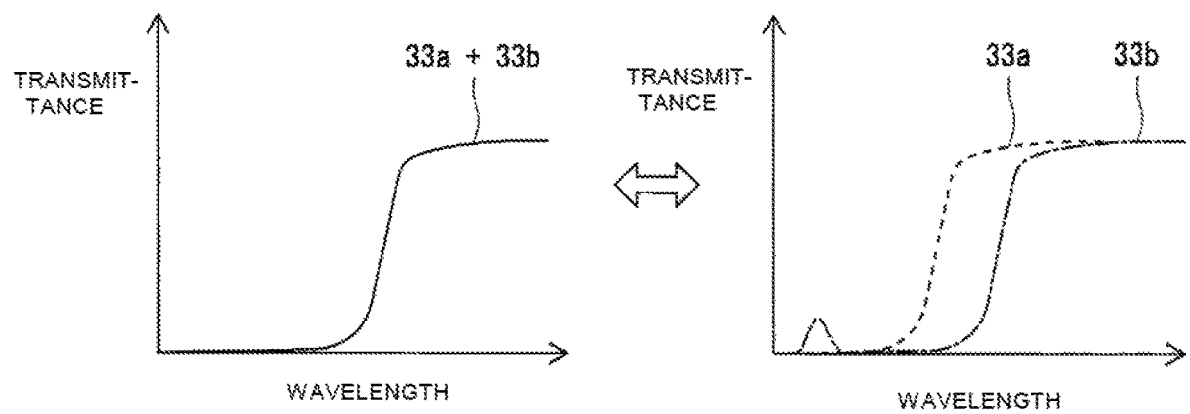
FIG. 7 is a diagram showing a relationship between a transmittance and a wavelength of light in the encapsulant layer as the second embodiment.

Hereinafter, a description is given in detail of a second embodiment with reference to FIG. 6. FIG. 6 is a sectional view of an encapsulant layer 50 similar to FIG. 4. FIG. 7 is a diagram showing a relationship between a transmittance and a wavelength of light in the encapsulant layer 50. FIG. 7 shows on the right a case of an encapsulant layer which contains only each of a first wavelength conversion material $33a$ and a second wavelength conversion material $33b$ by way of comparison. In the following description, a different point from the first embodiment is mainly explained, and the same components as the first embodiment are designated by the same reference signs and duplicated description is omitted.

In the second embodiment, a structure of the encapsulant layer 50 is different from the encapsulant layer 30 in the first embodiment. Concretely, the encapsulant layer 50 is different from the encapsulant layer 30, which contains only one kind of wavelength conversion material 33, in that it contains two kinds, namely the first wavelength conversion material $33a$ and the second wavelength conversion material $33b$. The second wavelength conversion material $33b$ is a material which absorbs and wavelength-converts light of a longer wavelength than the first wavelength conversion material $33a$.

The first wavelength conversion, material $33a$ and the second wavelength conversion material $33b$ have at least the maximal absorption wavelength not overlapping each other, for example. Moreover, at least the maximum emission wavelength of the first wavelength conversion material 33a and the maximal absorption wavelength of the second wavelength conversion material 33b may not overlap each other. It is preferable that the first wavelength conversion material 33a substantially does not absorb the ultraviolet rays or the like absorbed by the second wavelength conversion material 33b, and the second wavelength conversion material 33b substantially does not absorb the light wavelength-converted by the first wavelength conversion material 33a.

The first wavelength conversion material 33a and the second wavelength conversion material 33b are not specifically limited in individual materials so long as a combination thereof satisfies the above relationship, and the same material as the wavelength conversion material 33 may be used, for example. As an example of combination, a perylene-based dye may be used for the first wavelength conversion material 33a and a fluorescein-based dye may be used for the second wavelength conversion material 33b. To the first wavelength conversion material 33a and the second wavelength conversion material 33b, materials may be applied which are of the same kind as each other (e.g., perylene-based dye) and different from each other in wavelength conversion characteristics (absorption wavelength and emission wavelength).

In examples shown in FIG. 6, the first wavelength conversion material 33a is contained in a light-receiving-surface side area 51, and the second wavelength conversion material 33b is contained in a rear-surface side area 52. A concentration of the second wavelength conversion material 33b in the rear-surface side area 52 is higher in a gap region 52x than in a hidden region 52y. Moreover, a part of the first wavelength conversion material 33a may be contained in the rear-surface side area 52, or a part of the second wavelength conversion material 33b may be contained in the light-receiving-surface side area 51. In the case where a part of the first wavelength conversion material 33a is contained in the rear-surface side area 52, the first wavelength conversion material 33a is contained in the gap region 52x in larger amounts than in the hidden region 52y, for example.

As shown in FIG. 7, two kinds that are the first wavelength conversion material 33a and the second wavelength conversion material 33b are used to improve a conversion efficiency of the ultraviolet rays which contribute less to power generation and deteriorate the constituent material, for example. In a case of the encapsulant layer containing only the first wavelength conversion material 33a, the ultraviolet rays close to the visible region, for example, cannot be sufficiently converted in some cases. On the other hand, in a case of the encapsulant layer containing only the second wavelength conversion material 33b, a part of the ultraviolet rays of a shorter wavelength, for example, is difficult to convert. Using in combination the first wavelength conversion material 33a and the second wavelength conversion material 33b makes it possible to remove disadvantages in a case where either is used alone.

A concentration of the first wavelength conversion material 33a (hereinafter, referred to as "$\rho_{33a}$") may be higher in the light-receiving-surface side area 51 than the concentration of the second wavelength conversion material 33b. In addition, the concentration of the second wavelength conversion material 33b (hereinafter, referred to as "$\rho_{33b}$") may be higher in the rear-surface side area 52 than the concentration of the first wavelength conversion material 33a. The second wavelength conversion material 33b converting the light of a longer wavelength is likely to suffer damage from the light of a shorter wavelength compared to the first wavelength conversion material 33a, but deterioration of the second wavelength conversion material 33b can be suppressed by applying the relevant concentration distribution. In other words, the first wavelength conversion material 33a converts the light of a shorter wavelength which deteriorates the second wavelength conversion material 33b, protecting the second wavelength Conversion material 33b. The light of a longer wavelength which the first wavelength conversion material 33a cannot convert may be converted by the second wavelength conversion material. 33b contained in the rear-surface side area 52 in large amounts.

Concretely, $\rho_{33a}$ in the light-receiving-surface side area 51 may be 0.1 to 15 wt % with respect to a total weight of the light-receiving-surface side area 51 or 1.5 to 10 wt %, in a case where the first wavelength conversion material 33a is an inorganic system compound. $\rho_{33a}$ may be 0.02 to 2.0 wt % with respect to the total weight of the light-receiving-surface side area 51 or 0.05 to 0.8 wt %, in a case where the first wavelength conversion material 33a is an organic system compound. $\rho_{33b}$ in the light-receiving-surface side area 51 may be 0 to 1.5 wt % with respect to the total weight of the rear-surface side area 51 or 0 to 0.1 wt % in a case where the second wavelength conversion material 33b is an inorganic system compound. $\rho_{33b}$ may be 0 to 0.05 wt % with respect to the total weight of the rear-surface side area 51 or 0 to 0.02 wt % in a case where the second wavelength conversion material 33b is an organic system compound.

$\rho_{33a}$ in the rear-surface side area 52 may be 0 to 1.5 wt % with respect to a total weight of the rear-surface side area 52 or 0 to 0.1 wt % in a case where the first wavelength conversion material 33a is an inorganic system compound may be 0 to 0.05 wt % with respect to the total weight of the rear-surface side area 52 or 0 to 0.02 wt % in a ease where the first wavelength conversion material 33a is an organic system compound. $\rho_{33b}$ in gap region 52x of the rear-surface side area 52 may be 0.1 to 15 wt % with respect to a total weight of the gap region 52x or 1.5 to 10 wt %, in a case where the second wavelength conversion material 33b is an inorganic system compound. $\rho_{33b}$ may be 0.02 to 2.0 wt % with respect to the total weight of the gap region 52x or 0.05 to 0.8 wt %, in a case where the second wavelength conversion material 33b is an organic system compound.

Note that in a case where materials are required to be used in which an emission wavelength of the first wavelength conversion material 33a and an absorption wavelength of the second wavelength conversion material 33b overlap each other in large amounts, concentration distributions described above, for example inverted. In other words, in this case, $\rho_{33a}$ is set to be lower than $\rho_{33b}$ in the light-receiving-surface side area 51 and $\rho_{33a}$ is set to be higher than $\rho_{33b}$ in the rear-surface side area 52 to suppress duplicated wavelength conversion, enhancing the wavelength conversion efficiency.

In the embodiment, the case is shown where two kinds of wavelength conversion material, namely the first wavelength conversion material 33a and the second wavelength conversion material 33b, are used, but three or more kinds of wavelength conversion materials may be used.

REFERENCE SIGNS LIST 10 solar cell module, 11 solar cell, 12 first protective member, 13 second protective member, 14 conducting wire, 15 solar cell panel, 15a lateral face, 16 frame, 17 adhesive, 18 reflector, 20 photoelectric conversion part, 21 semiconductor substrate, 22, 23 amorphous semiconductor layer, 24, 25 transparent conductive layer, 30, 50, 100 encapsulant layer, 31, 35, 51 light-receiving-surface side area, 32, 36, 52 rear-surface side area, 33 wavelength conversion material, 33a first wavelength conversion material, 33b second wavelength conversion material, 32x, 36x, 52x gap region, 32y, 36y, 52y hidden region

The invention claimed is:

1. A solar cell module comprising: a plurality of solar cells;
   a first protective member provided on a light-receiving surface side of the solar cells;
   a second protective member provided on a rear-surface side of the solar cells opposite to the light-receiving surface side;
   a first encapsulant layer provided between the first protective member and the plurality of solar cells;
   a second encapsulant layer provided between the second protective member and the plurality of solar cells; and
   a wavelength conversion material absorbing a light of a specific wavelength and converting the light into a light of a longer wavelength,
   wherein the wavelength conversion material is contained in the first encapsulant and the second encapsulant,
   a concentration of the wavelength conversion material of the first encapsulant is uniform over an entirety of the first encapsulant, and
   a concentration of the wavelength conversion material in a first region of the second encapsulant overlapping with the plurality of solar cells is lower than a concentration of the wavelength conversion material in a second region of the second encapsulant not overlapping with the plurality of solar cells, and
   wherein the second encapsulant consists of the first region and the second region,
   wherein the wavelength conversion material includes a first wavelength conversion material, and a second wavelength conversion material which absorbs and wavelength-converts a light of a longer wavelength than the first wavelength conversion material, a concentration of the first wavelength conversion material is higher, in the first encapsulant layer located closer to a side of the first protective member than to a corresponding solar cell of the plurality of solar cells, than a concentration of the second wavelength conversion material, and the concentration of the second wavelength conversion material is higher in the second encapsulant layer than the concentration of the first wavelength conversion material, and
   the concentration of the second wavelength conversion material of the second encapsulant is greater in the second region than in the first region.

2. The solar cell module according to claim 1, wherein the wavelength conversion material performs wavelength-conversion into light of a wavelength between 450 nm and 490 nm.

3. The solar cell module according to claim 1, wherein each solar cell of the plurality of the solar cells includes a heterojunction layer, and the wavelength conversion material absorbs and wavelength-converts light of a wavelength having an energy equal to or more than a bandgap of the heterojunction layer.

4. The solar cell module according to claim 1, wherein a refractive index of an area containing the wavelength conversion material in the first encapsulant layer is higher than a refractive index of an outermost layer of the first protective member.

5. The solar cell module according to claim 1, further comprising a reflector which is provided to cover a lateral face of a solar cell panel and reflects light wavelength-converted by the wavelength conversion material, the solar cell panel being constituted by at least one solar cell of the plurality of solar cells, the first protective member, the second protective member, the first encapsulant layer and the second encapsulant layer.

6. The solar cell module according to claim 1,
   wherein the wavelength conversion material absorbs ultraviolet light to convert into visible light.

7. The solar cell module according to claim 1,
   wherein the wavelength conversion material absorbs light with a first wavelength of shorter than 380 nm to convert into a second wavelength of 400 to 800 nm.

8. The solar cell module according to claim 1,
   wherein the concentration of the wavelength conversion material in the second region of the second encapsulant is lower than the concentration of the wavelength conversion material of the entire first encapsulant.

9. The solar cell module according to claim 1,
   wherein the solar cell module includes a frame, and a light reflector layer disposed inside the frame.

* * * * *